(12) United States Patent
Brokaw

(10) Patent No.: US 6,380,807 B1
(45) Date of Patent: Apr. 30, 2002

(54) DYNAMIC BRIDGE SYSTEM WITH COMMON MODE RANGE EXTENSION

(75) Inventor: Adrian Paul Brokaw, Burlington, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/718,742

(22) Filed: Nov. 22, 2000

(51) Int. Cl.$^7$ .................................................. H03F 3/45
(52) U.S. Cl. ............................. 330/258; 330/69; 330/85
(58) Field of Search ............................. 330/258, 69, 85, 330/259

(56) References Cited

U.S. PATENT DOCUMENTS

| | | | | |
|---|---|---|---|---|
| 3,531,733 A | * | 9/1970 | Haines | 330/30 |
| 4,752,744 A | * | 6/1988 | Aoki | 330/252 |
| 6,069,533 A | * | 5/2000 | Kim | 330/258 |
| 6,265,941 B1 | * | 7/2001 | Lopata | 330/258 |

OTHER PUBLICATIONS

*Operational Amplifiers Theory and Practice*, James K. Roberge, John Wiley & Sons, Inc., Boston, MA, 1975, pp. 449–450.

"High Common–Mode Voltage Difference Amplifier", Analog Devices Tech. Notes, Analog Devices, Inc., Norwood, MA, pp. 1–12.

"Noise and Operational Amplifier Circuits", L. Smith and D.H. Sheingold, *Analog Dialogue*, Cambridge, MA, vol. 1, No. 1, Mar. 1969, pp. 1–15.

* cited by examiner

*Primary Examiner*—Robert Pascal
*Assistant Examiner*—Henry Choe
(74) *Attorney, Agent, or Firm*—Iandiorio & Teska

(57) ABSTRACT

A dynamic bridge system with common mode range extension includes a dynamic bridge circuit having a pair of input terminals for receiving common mode and normal signals, a pair of intermediate terminals and an output terminal and reference terminal; a differential amplifier has its inputs connected to the intermediate terminals and its output connected to the output terminal; a pair of balanced loads is each connected at one end to an intermediate terminal; and an inverting amplifier responsive to the common mode signal at the inputs of the differential amplifier drives the other ends of the balanced loads in opposition to changes in the common mode signals at the inputs of the differential amplifier.

5 Claims, 5 Drawing Sheets

DYNAMIC BRIDGE SYSTEM WITH COMMON MODE RANGE EXTENSION

FIELD OF INVENTION

This invention relates to a dynamic bridge system with a common mode range extension and more particularly to such a system with noise gain reduction.

BACKGROUND OF INVENTION

A dynamic bridge or subtractor circuit employs an amplifier and bridge to suppress common mode signals and pass or amplify normal mode signals. See *Operational Amplifiers Theory and Practice*, James K. Roberge, John Wiley & Sons, Inc., pages 449–450. Such circuits are often used where the common mode signals are substantially larger than the normal mode signals. In some cases the common mode signals are so large that they exceed the power supply limits by a significant amount. One approach to this problem uses a pair of balanced loads at the inputs to the amplifier to reduce the common mode signals. See *High Common-Mode Voltage Difference Amplifier, Analog Devices Tech. Notes*, Analog Devices, Inc., Norwood, Mass., pages 1–12. While this works well to reduce the common mode signals while maintaining the normal mode signals it introduces a further problem in that it increases the noise gain of the circuit. See *Analog Dialogue, Noise and Operational Amplifier Circuits*, Lewis Smith and D. H. Sheingold, *A Journal for the Exchange of Analog Technology*, Vol. 3, No.1, pages 3–14. A common practice is to make the balanced loads small enough to effect sufficient attenuation of the common mode signals applied to the amplifier while at the same time large enough to minimize the noise gain. Often this is not satisfactory and provides less performance than desired.

SUMMARY OF THE INVENTION

It is therefore an object of this invention to provide an improved dynamic bridge system with an extended common mode range.

It is a further object of this invention to provide an improved dynamic bridge system with noise gain reduction.

It is a further object of this invention to provide an improved dynamic bridge system with increased common mode rejection.

The invention results from the realization that a dynamic bridge system with extended common mode range and rejection and noise gain reduction can be achieved by having a pair of balanced loads connected to the intermediate terminals of the bridge circuit along with the inputs to the differential amplifier and using an inverting amplifier responsive to the common mode signals at the inputs of the differential amplifier for driving the other ends of the balanced loads in opposition to changes in the common mode signals at the input terminals of the bridge circuit.

The invention features a dynamic bridge system with common mode range extension including a dynamic bridge circuit having a pair of input terminals for receiving common mode and normal mode signals, a pair of intermediate terminals, an output terminal and a reference terminal. There is a differential amplifier having its inputs connected to the intermediate terminals and its output connected to the output terminal. A pair of balanced loads is each connected at one end to an intermediate terminal. An inverting amplifier responsive to the common mode signal at the inputs of the differential amplifier drives the other ends of the balance loads in opposition to changes in the common mode signals at the inputs of the differential amplifier.

In a preferred embodiment, the system may include a feedback attenuator circuit between the output of the differential amplifier and the output terminal for increasing the normal mode gain of the system. There may be a compensating circuit in series with the reference terminal for balancing the reference terminal impedance relative to the output terminal impedance. There may be a gain adjustment impedance interconnected between the attenuator circuit and the compensating circuit for adjusting the gain of the system without disturbing the balance of the bridge circuit. The inverting amplifier may include at least a transistor and a load for setting the limits of the inverting amplifier output to match the limits of the common mode signal at the input terminals

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
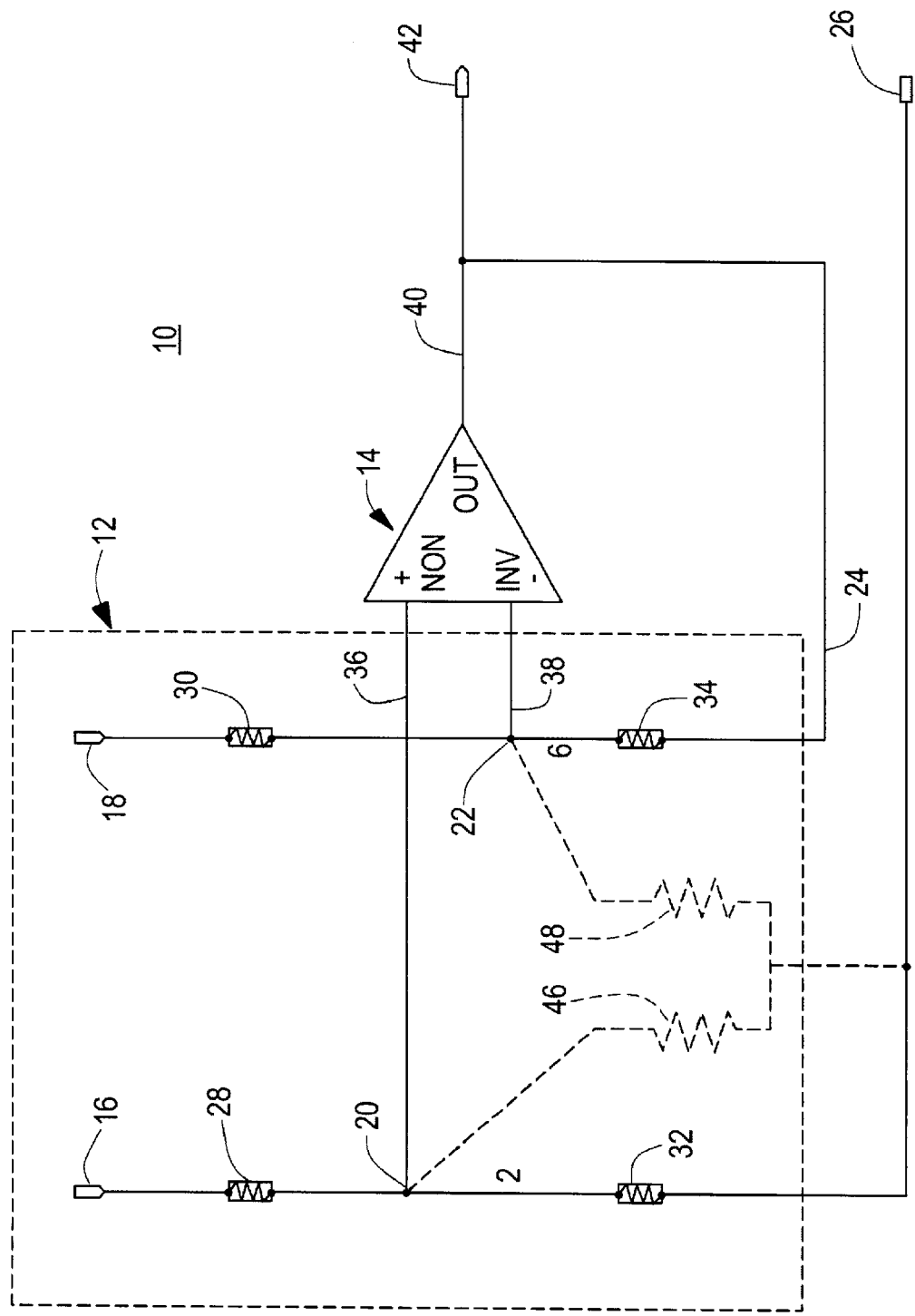
FIG. 1 is a schematic diagram of a prior art dynamic bridge.
Figure 2:
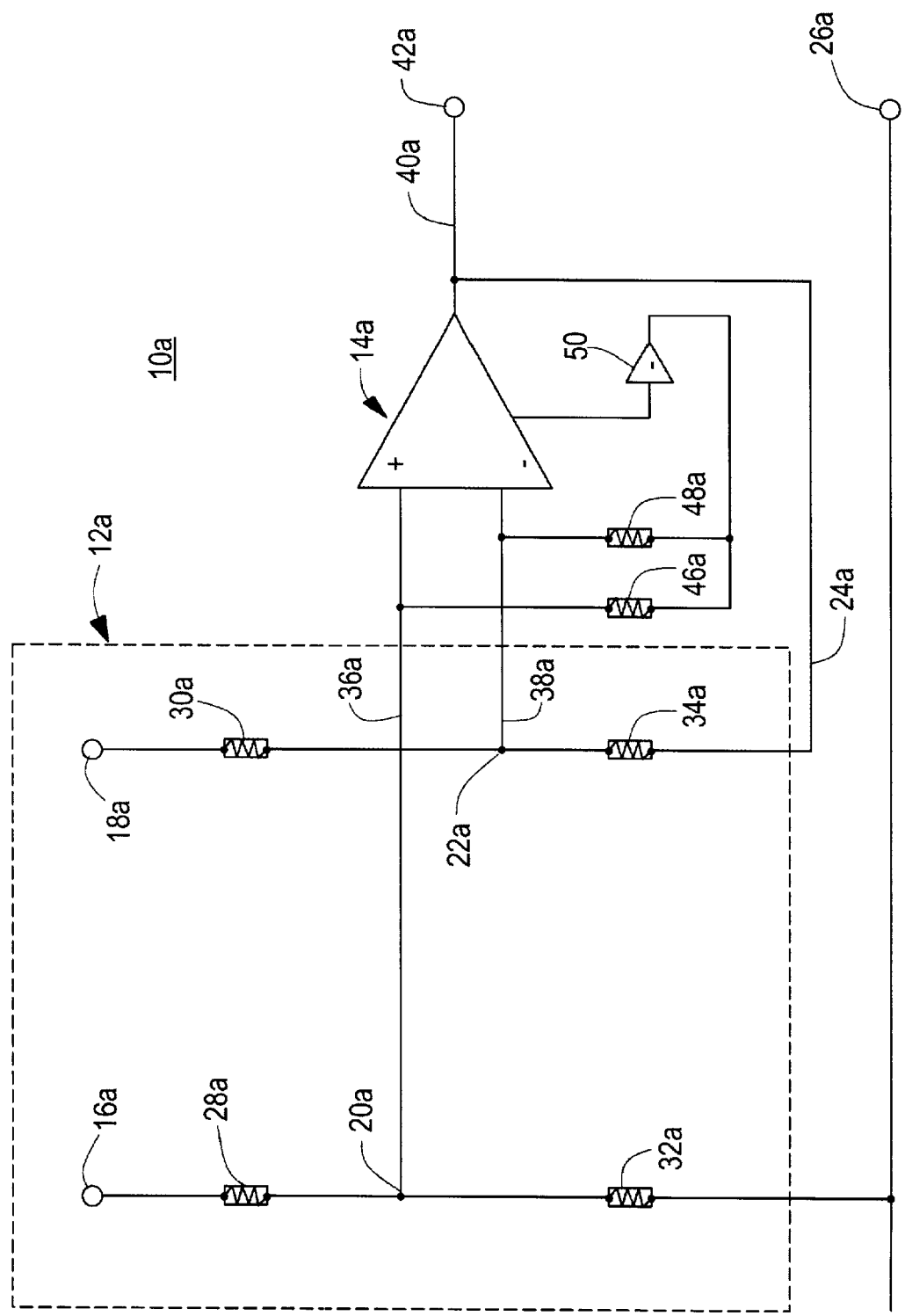
FIG. 2 is a schematic diagram of a dynamic bridge system with extended range according to this invention.

There is shown in FIG. 1 a dynamic bridge system 10 according to prior art including a bridge circuit 12 and differential amplifier 14. Dynamic bridge circuit 12 includes two input terminals 16 and 18, two intermediate terminals 20 and 22, an output terminal 24 and a reference terminal 26. Bridge circuit 12 includes four impedances typically resistances 28, 30, 32 and 34. Differential amplifier 14 has its inputs 36 and 38 connected to the intermediate terminals 20 and 22, respectively, and its output 40 is connected with the output terminal 24 of bridge circuit 12 to the output of the system at 42.

For proper operation, the ratio of resistance 28 to resistance 32 is the same as the ratio of the value of resistance 30 to resistance 34. In addition, the resistances 28 and 30 and 32 and 34, respectively, may be equal but that is not necessary. In operation, differential amplifier 14 operates by providing an output which is just sufficient to keep the difference in voltage at intermediate terminals 20 and 22 at zero in response to any fluctuations in the common mode signals and normal mode signals which appear across input terminals 16 and 18. Thus signals that are common to both input terminals 16 and 18, such as the common mode signals will be suppressed at the output 40 and 42 and any signal such as normal mode signals which are differentially applied, will be passed.

When the common mode input signal appearing at input terminals 16 and 18 is large compared to the power supplied to amplifier 14, the excursion of the signal at the intermediate nodes and at the inputs 36 and 38 to amplifier 14 can overdrive the amplifier and result in errors and loss of signal.

To combat this, the prior art has added a pair of balanced loads 46 and 48 interconnected between the respective intermediate terminals 20 and 22 and ground. These balanced load resistors 46 and 48 do reduce the common mode signal, but introduce increases in the noise gain so that noise and offset of the amplifier appear large as referred to the input terminals 16 and 18. In FIGS. 2–5 like parts have been given like numbers and similar parts like numbers accompanied by a lower case letter.

In accordance with this invention, the common mode signal range is extended; the common mode signal is suppressed; and the noise gain is reduced as compared to the prior art solutions. This invention uses a dynamic bridge system 10a, FIG. 2 in which an inverting amplifier 50 responsive to the common mode signal at the inputs 36a and 38a of differential amplifier 14a drives the ends of balanced loads 46a and 48a to just oppositely compensate for the fluctuations of the common mode signals appearing at input terminals 16a and 18a. For example, a large increase in the common mode input at input terminals 16a and 18a will normally appear across inputs 36a and 38a of differential amplifier 14a. However, with this invention, inverting amplifier 50 responding to that increase in common mode current, outputs an opposite voltage to resistors 46a and 48a which drives the voltage at inputs 36a and 38a down or in the opposite direction to reduce the size of the common mode signal appearing at inputs 36a and 38a. In this way, larger common mode signal fluctuations can be tolerated without overdriving the differential amplifier 14a even though it would be operated at a much lower voltage.

Figure 3:
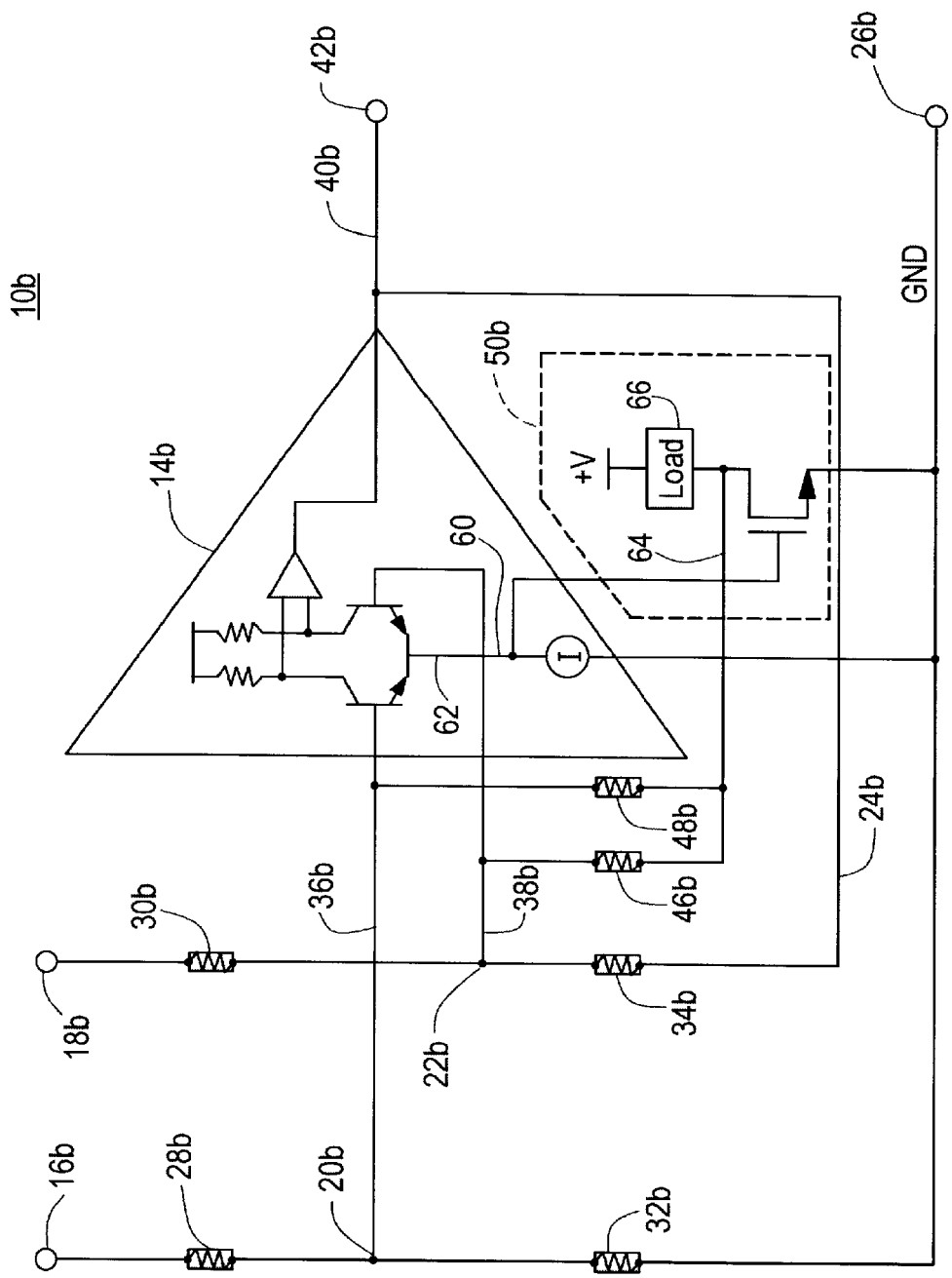
FIG. 3 is a view similar to FIG. 2 showing the differential amplifier and inverting amplifier in more detail.

The signal representative of the common mode signal at the inputs 36b and 38b, FIG. 3, of differential amplifier 14b which drive inverting amplifier 50b can be obtained in a number of ways. In a preferred embodiment, it is obtained from the common emitter connection 60 of the differential circuit 62 which form a part of a typical differential amplifier. Inverting amplifier 50b includes at least a transistor or semi-conductor device such FET 64 and a load 66. The gain of inverting amplifier 50b is set so that in conjunction with the values chosen for the resistances 28b, 30b, 32b and 34b and balanced load resistances 46b and 48b, the output of amplifier 50b will be opposite to the fluctuation of the common mode signal at input terminals 16b and 18b and just enough to offset it as it appears at the inputs 36b and 38b of differential amplifier 14b.

Bearing on the magnitude of the common mode signal as it appears at inputs 36b and 38b as compared to the common mode signal magnitude appearing at input terminal 16b and 18b are the values of balance load resistors 46b and 48b. A larger value for those resistances increases the allowable common mode signal and decreases the noise gain. Conversely, a lower value for resistances 46b and 48b increases the common mode range, but it also increases the noise gain. Inverting amplifier 50b may also be configured as a very high gain amplifier in which case it provides a large output minimizing the common mode signal excursions at the inputs 36b and 38b over part of the common mode signal input range, but provides less suppression over the remainder of the range when the common mode signal is reaching the upper end of its range.

Figure 4:
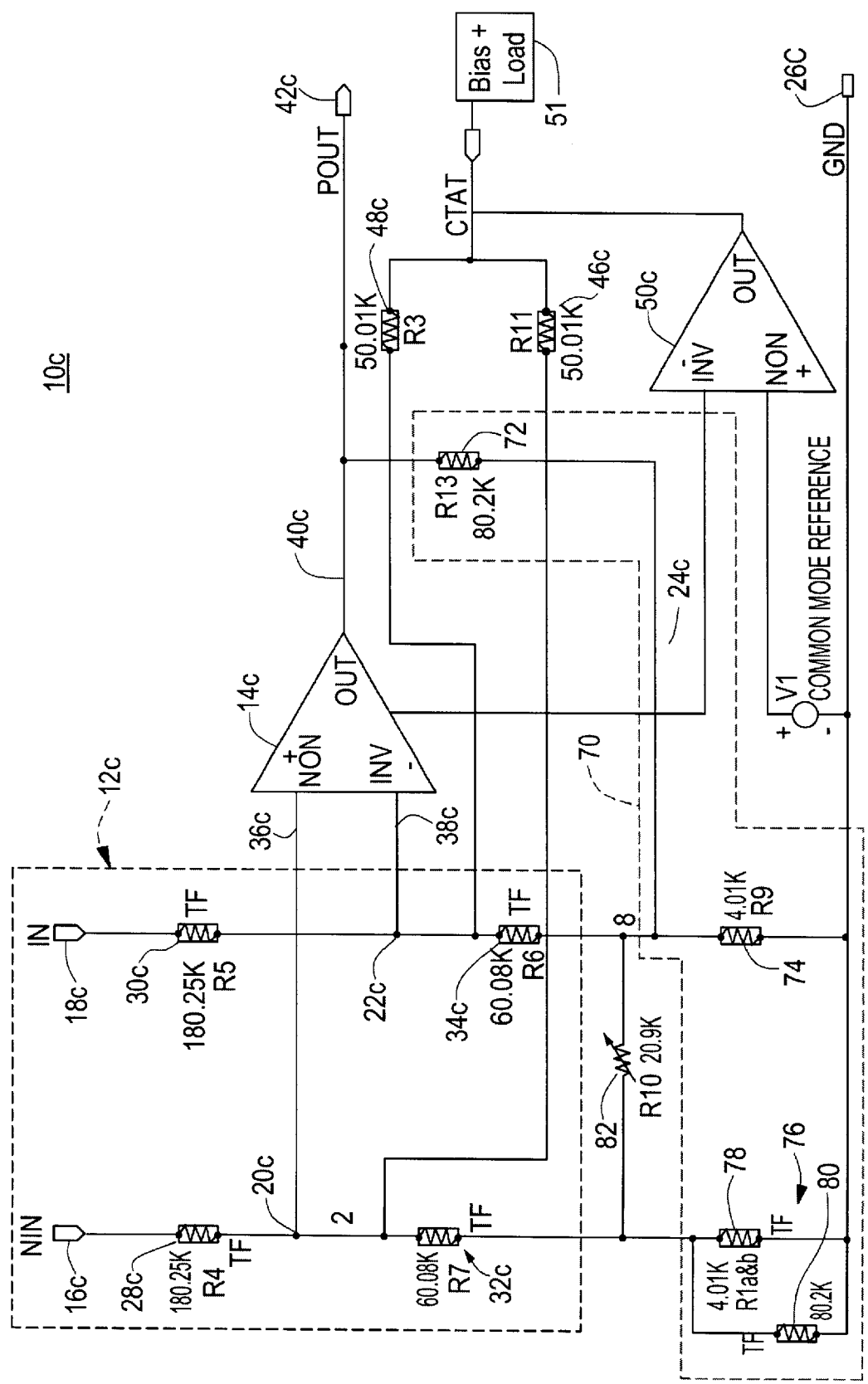
FIG. 4 is a view similar to FIGS. 2 and 3 with an attenuator circuit.

The gain of the system may be increased by including a feedback attenuator circuit 70, FIG. 4, which operates to attenuate the signal from the output 40c of differential amplifier 14c back to its input 38c. In this way the amplifier is driven to provide a larger signal at its output 40c and thus provide a greater output at output terminal 42c. Inverting amplifier 50c has associated with it bias and load circuit 51. The feedback attenuator circuit 70 includes a resistance 72 interconnected between output 40c of differential amplifier 14c and resistor 34c in bridge circuit 12c. Also attached between this point and ground is a second resistor 74. These two resistances provide the attenuation desired to increase the gain provided by the overall system. The addition of resistances 72 and 74, however, unbalances bridge circuit 12c. In order to bring bridge circuit 12c back into balance a compensating circuit 76 may be added including one or more resistances 78 and 80 which matches the leg of bridge circuit 12c which includes resistances 28c and 32c with the leg of bridge 12c that include resistances 30c and 34c which have been effected by the attenuation circuit including resistances 72 and 64.

Figure 5:
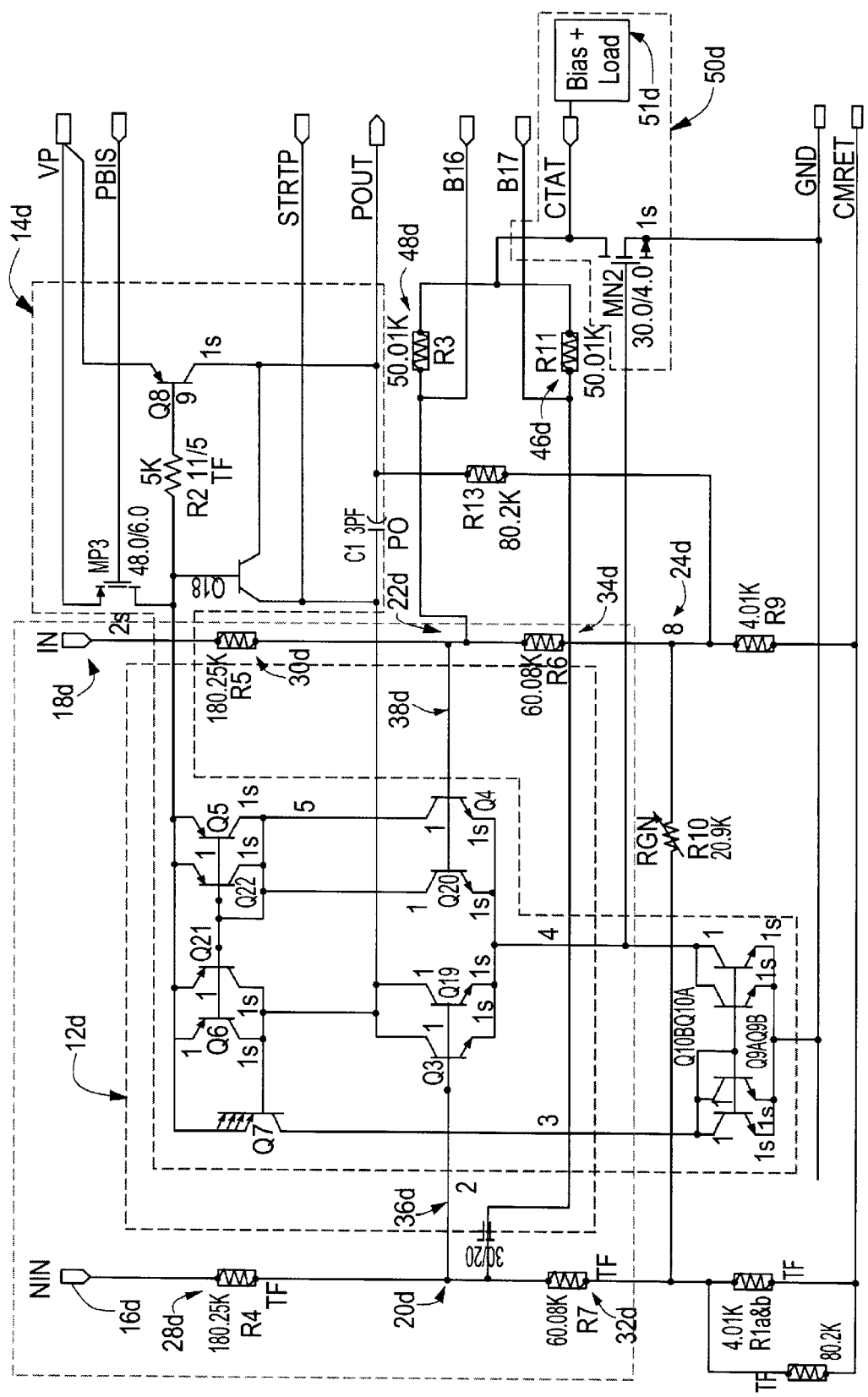
FIG. 5 is a detailed schematic diagram of a dynamic bridge system in accordance with a preferred embodiment of the invention showing typical component values.

While the gain of the system may be adjusted by changing the values of resistances 72 and 74 as can be seen, this creates the additional problem that each time one or both of them are changed to change the gain, the balance of the bridge circuit is disturbed and resistances 78 and 80 must be adjusted accordingly. A simpler way of doing this is realized by using adjustable resistance 82, such as a potentiometer, which extends between resistance 32c and resistance 34c. In this position, adjustable resistor 82 can have its value changed without disturbing the balance of bridge circuit 12c, while it attenuates more or less the output from differential amplifier 14c fed back to its input 38c. One specific implementation of the system of FIG. 4 is shown in FIG. 5 in greater detail with component values indicated.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A dynamic bridge system with common mode range extension comprising:
    a dynamic bridge circuit having a pair of input terminals for receiving common mode and normal mode signals, a pair of intermediate terminals and an output terminal and reference terminal;
    a differential amplifier having its inputs connected to said intermediate terminals and its output connected to said output terminal;
    a pair of balanced loads each connected at one end to a said intermediate terminal; and
    an inverting amplifier responsive to the common mode signal at said inputs of said differential amplifier for driving the other ends of said balanced loads in opposition to changes in the common mode signals at said inputs of said differential amplifier.

2. The dynamic bridge system of claim 1 further including a feedback attenuator circuit between said output of said differential amplifier and said output terminal for increasing the normal mode gain of the system.

3. The dynamic bridge system of claim 2 further including a compensating circuit in series with said reference terminal for balancing the reference terminal impedance relative to the output terminal impedance.

4. The dynamic bridge system of claim 3 further including a gain adjustment impedance interconnected between said attenuator circuit and said compensating circuit.

5. The dynamic bridge system of claim 1 in which said converting amplifier includes at least a transistor and a load for setting the limits of said inverting amplifier output to match the limits of the common mode signal at said input terminals.

* * * * *